US010024927B2

United States Patent
Katano et al.

(10) Patent No.: US 10,024,927 B2
(45) Date of Patent: Jul. 17, 2018

(54) CONNECTOR FOR MONITORING THE VOLTAGE OF A FUEL CELL STACK

(71) Applicant: TOYOTA JIDOSHA KABUSHIKI KAISHA, Toyota-shi, Aichi-ken (JP)

(72) Inventors: Koji Katano, Toyota (JP); Tsutomu Shirakawa, Toyota (JP); Hiroyuki Imanishi, Toyota (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 0 days.

(21) Appl. No.: 14/770,128

(22) PCT Filed: Aug. 12, 2014

(86) PCT No.: PCT/JP2014/071298
§ 371 (c)(1),
(2) Date: Aug. 25, 2015

(87) PCT Pub. No.: WO2015/064177
PCT Pub. Date: May 7, 2015

(65) Prior Publication Data
US 2016/0231391 A1    Aug. 11, 2016

(30) Foreign Application Priority Data
Oct. 30, 2013   (JP) .................... 2013-225504

(51) Int. Cl.
*H02J 7/00*      (2006.01)
*G01R 31/36*   (2006.01)
(Continued)

(52) U.S. Cl.
CPC ....... *G01R 31/3696* (2013.01); *G01R 31/362* (2013.01); *G01R 31/3658* (2013.01);
(Continued)

(58) Field of Classification Search
CPC .................................................. G01R 31/3696
(Continued)

(56) References Cited

U.S. PATENT DOCUMENTS 8,026,012 B2 *   9/2011   Ariyoshi ............. H01M 8/0247
                                                                  429/432
9,039,462 B2 *   5/2015   Yoon ...................... H01R 13/62
                                                                  439/752
(Continued)

FOREIGN PATENT DOCUMENTS

CN          101375446 A        2/2009
JP          2007-200632         8/2007
(Continued)

*Primary Examiner* — Richard V Muralidar
(74) *Attorney, Agent, or Firm* — Finnegan, Henderson, Farabow, Garrett & Dunner LLP

(57) ABSTRACT

A cell monitor connector is provided that can prevent detachment of the cell monitor connector from a fuel cell device with a simple configuration. A connector 4 for measuring voltage has a housing 41 with a plurality of slits 45 formed therein and an end of a separator 21 of a plurality of fuel cells 2 can be inserted into the slits 45. The housing 41 has a rib 46R at at least one end in the stacking direction of the fuel cells 2 such that the rib 46R projects in a direction perpendicular to the stacking direction.

3 Claims, 7 Drawing Sheets

(51) Int. Cl.
    *H01R 24/20*     (2011.01)
    *H01M 8/04537*     (2016.01)
    *H01R 13/58*     (2006.01)
    *H01R 13/62*     (2006.01)
    *H01R 107/00*     (2006.01)

(52) U.S. Cl.
    CPC ........ *H01M 8/04559* (2013.01); *H01R 24/20* (2013.01); *H01R 13/5812* (2013.01); *H01R 13/62* (2013.01); *H01R 2107/00* (2013.01)

(58) Field of Classification Search
    USPC .................................................. 320/101, 107
    See application file for complete search history.

(56) References Cited

U.S. PATENT DOCUMENTS

| | | | |
|---|---|---|---|
| 9,406,920 B2 * | 8/2016 | Furuya | H01M 2/202 |
| 9,847,540 B2 * | 12/2017 | Shirakawa | H01M 8/04552 |
| 2004/0046526 A1 * | 3/2004 | Richards | H01M 8/02 |
| | | | 320/101 |
| 2008/0003482 A1 | 1/2008 | Komiyama | |
| 2009/0136822 A1 | 5/2009 | Aoto | |
| 2013/0236805 A1 | 9/2013 | Furuya et al. | |

FOREIGN PATENT DOCUMENTS

| | | |
|---|---|---|
| JP | 2013-118047 | 6/2013 |
| JP | 2013-187050 | 9/2013 |

* cited by examiner

Fig. 1
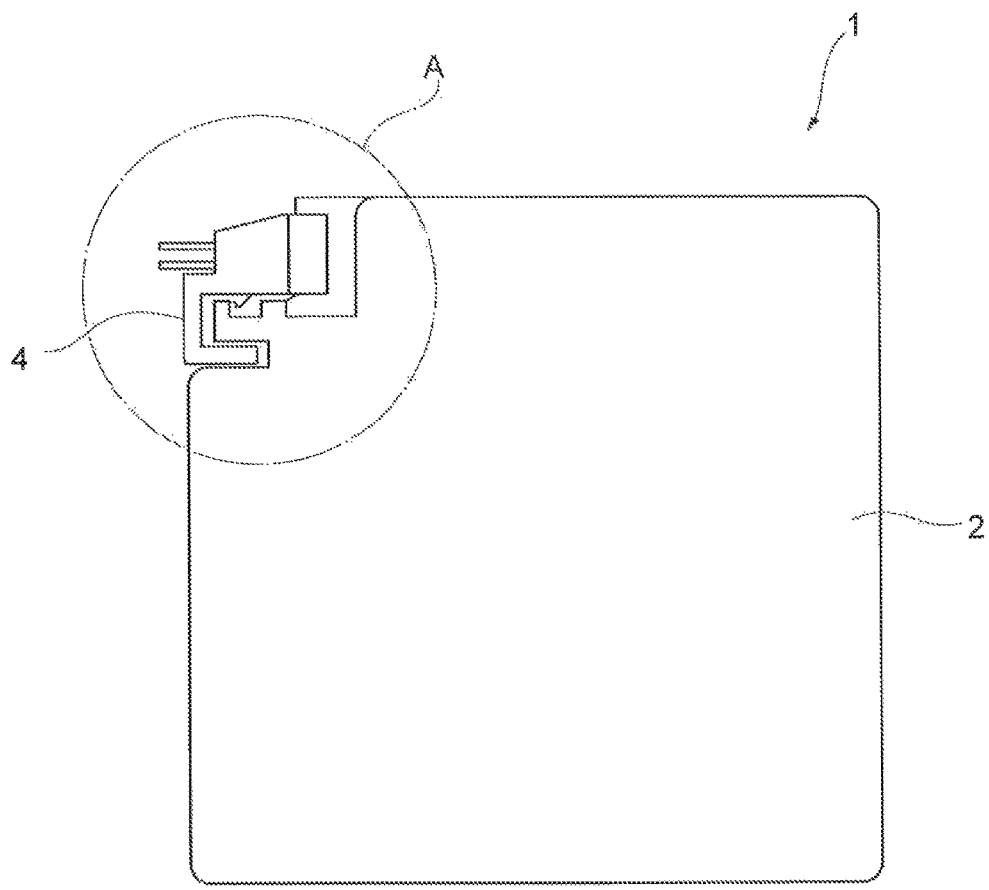
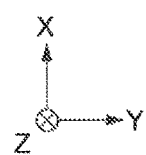

Fig. 5
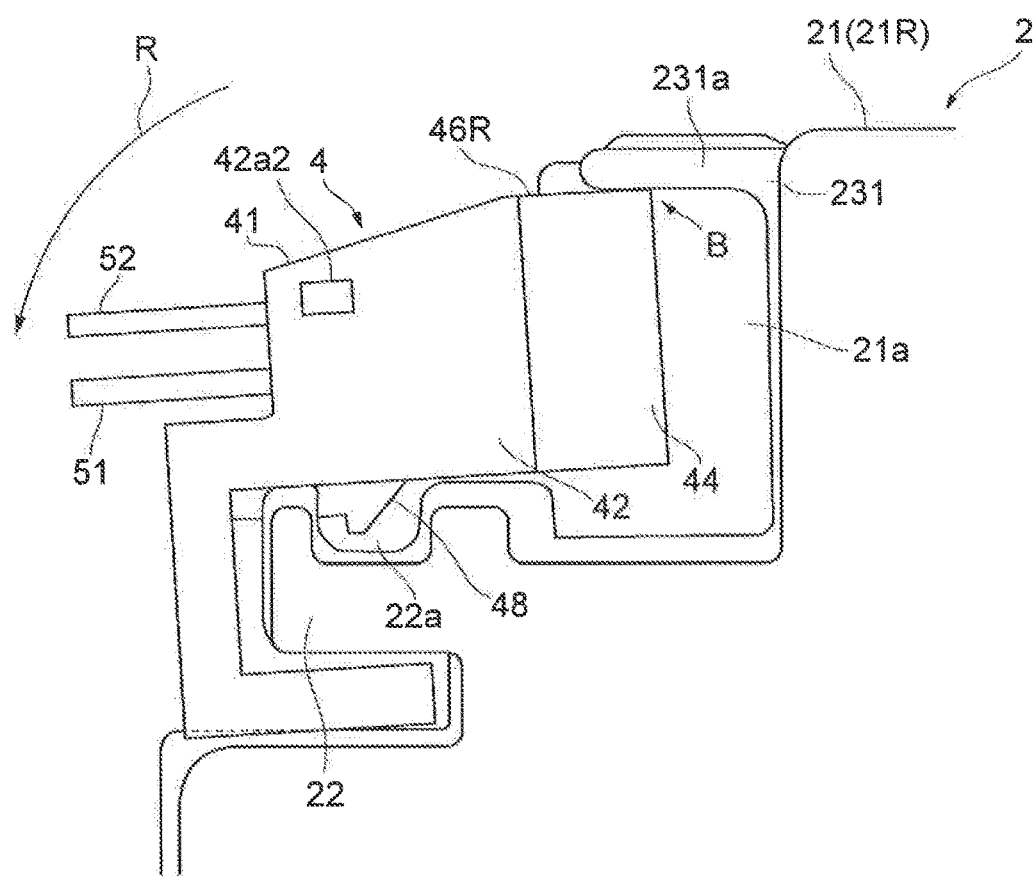
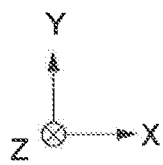

CONNECTOR FOR MONITORING THE VOLTAGE OF A FUEL CELL STACK

CROSS-REFERENCE TO RELATED APPLICATIONS

This application is a national phase application of International Application No. PCT/JP2014/071298, filed Aug. 12, 2014, and claims the priority of Japanese Application No. 2013-225504, filed Oct. 30, 2013, the content of both of which is incorporated herein by reference.

TECHNICAL FIELD

The present invention relates to a cell monitor connector to be connected to an end of a fuel cell device formed of a plurality of fuel cells stacked in a predetermined stacking direction, so as to monitor the state of the fuel cells by way of voltage measurement.

BACKGROUND ART

In a fuel cell device comprised of a plurality of stacked fuel cells, it is common practice to measure (monitor) the voltage of the fuel cell device and to use the obtained measurement value as an index for control. More specifically, a measured voltage is used as an index for controlling the supply of a fuel gas and an oxidizing gas to the fuel cells, or as an index for diagnosing failure, etc., of the fuel cells. In order to measure the voltage of the fuel cell device, a connector for measuring voltage is electrically connected to a part of the fuel cell device.

Meanwhile, in order to obtain a fuel cell device smaller in size, a reduction in thickness of each fuel cell is now being attempted. When making the fuel cell thinner, maintaining its structural strength is an issue. If a connector is connected to the fuel cell as described above, the possibility of breakage of the fuel cell may increase due to an external force applied by the connector. In particular, when the fuel cell device is installed on a vehicle, unavoidable external forces, such as vibrations during driving, are continuously applied via the connector, which causes a great concern of breakage. Moreover, there is a concern of complicated assembly if a connector is connected to each of the cells.

In light of the above, Patent Document 1, indicated below, discloses a configuration in which one connector is electrically connected to several separators of the fuel cells. As a result, external force will be distributed and a load applied to each separator can be made relatively small so that breakage of the separators can be suppressed and ease of assembly can be improved.

PRIOR ART REFERENCE

Patent Document

Patent Document 1: JP2013-118047 A

SUMMARY OF THE INVENTION

Problem to be Solved by the Invention

However, due to the structure of the fuel cell device having a plurality of stacked fuel cells, a connector to be connected to such fuel cell device has a problem of being prone to backlash. More specifically, since the fuel cell device is likely to have a dimensional error in its stacking direction, the part of the connector to be connected to several fuel cells needs to have a large dimensional tolerance. For this reason, connection between the fuel cell device and the connector will be loose, causing problems of backlash or detachment (the connector and the fuel cell device will be electrically disconnected) of the connector The present invention has been made in view of the above-described problems. An object of the present invention is to provide a cell monitor connector which can prevent detachment of the cell monitor connector from the fuel cell device, with a simple configuration.

Means for Solving the Problem

In order to solve the above-described problems, a cell monitor connector according to the present invention is a cell monitor connector to be connected to an end of a fuel cell device formed of a plurality of fuel cells stacked in a predetermined stacking direction, so as to measure voltage, the cell monitor connector comprising: a housing having a plurality of slits formed therein, wherein an end of a separator of the plurality of fuel cells can be inserted into the slits; a plurality of terminals provided inside the housing and electrically connectable to the end of the separator when the separator is inserted into the slit; and wires connected to the terminals, wherein the housing has a rib at at least one end in the stacking direction, such that the rib projects in a direction perpendicular to the stacking direction.

In the cell monitor connector according to the present invention, since the housing has a projecting rib, a rotation of the cell monitor connector can be suppressed by restricting the rotation of the rib. Accordingly, even if the cell monitor connector is set so as to have a large dimensional tolerance in order to accept dimensional errors that may occur in the fuel cell device configured by stacking a plurality of fuel cells, it is still possible to prevent detachment of the cell monitor connector from the fuel cell device.

In the cell monitor connector according to the present invention, it is preferable for the rib to be formed at a position facing a gasket of the fuel cell.

In the case where a projecting rib is formed in the housing, the rib may interfere with a constituent element of the fuel cell upon rotation of the cell monitor connector and such element and the rib may even be broken. In the preferable mode described above, the rib is formed at a position facing the gasket of the fuel cell so that the rib will first interfere with the gasket upon rotation of the cell monitor connector, thereby suppressing breakage as described above. The "gasket" referred to herein is a seal member for separating a fluid flow path formed in the fuel cell. Such gasket has elasticity, and thus deforms and absorbs impact when it interferes with the rib. Consequently, breakage can be prevented.

Further, in the cell monitor connector according to the present invention, it is preferable for the rib to be formed at a position in which the rib will interfere with the gasket of the fuel cell so as to restrict rotation of the cell monitor connector around an axis parallel to the stacking direction when the cell monitor connector is connected to the end of the fuel cell device.

In the above-described preferable mode, when the housing of the cell monitor connector rotates around an axis parallel to the stacking direction of the fuel cell device, the rib and the gasket of the fuel cell interfere with each other so that breakage of the rib can be prevented while suppressing rotation of the housing. As a result, even if the cell monitor connector is set so as to have a large dimensional tolerance in order to accept dimensional errors that may occur in the fuel cell device configured by stacking a plurality of fuel cells, it is still possible to prevent detachment of the cell monitor connector from the fuel cell device.

Further, in the cell monitor connector according to the present invention, it is also preferable for the plurality of terminals to be composed of a first terminal group including a first number of the terminals arranged with spaces therebetween on a first line extending in the stacking direction and a second terminal group including a second number of the terminals arranged with spaces therebetween on a second line which is substantially parallel to the first line, the second number being smaller than the first number by one, wherein the terminals arranged at both ends of the second group are closer to the center part of the housing in the stacking direction than the terminals arranged at both ends of the first group.

When the plurality of terminals is composed of a first group and a second group which are arranged substantially parallel to each other, and if the first terminal group and the second terminal group have the same number of terminals, the housing containing such terminals will have projecting parts on both ends thereof. Accordingly, if such cell monitor connectors are aligned along the fuel cell stacking direction, and if one cell monitor connector rotates due to an external force, the projecting part of the cell monitor connector may interfere with the projecting part of the adjacent cell monitor connector, which could lead to breakage.

In the preferable mode described above, the number of terminals aligned in the second group is smaller by one than the number of terminals aligned in the first group and the terminals at both ends of the second terminal group are closer to the center part of the housing than the terminals at both ends of the first terminal group. As a result, the formation of projection parts at both ends of the housing can be suppressed and interference and breakage of the adjacent cell monitor connectors can also, accordingly, be suppressed.

It is also preferable for the cell monitor connector according to the present invention to have a retainer which is inserted into the housing and holds the wires, wherein the housing has a recessed part on an outer surface thereof at a portion corresponding to the second terminal group, so that the retainer is fixed to the housing when a lock formed at both ends of the retainer is engaged with the recessed part.

In the above-described preferable mode, the housing has a recessed part on its outer surface at a portion corresponding to both ends of the second through-hole group in which the number of terminals to be arranged is relatively small, and the retainer is fixed by engaging the lock formed at both ends of the retainer with the recessed part. By engaging the lock with the recessed part of the housing, projection of the retainer from the housing can be suppressed and, as a result, checking the connection state between the cell monitor connector and the fuel cell device will be easy and connection can be further ensured.

Effect of the Invention

The present invention can provide a cell monitor connector which can prevent detachment of the cell monitor connector from the fuel cell device, with a simple configuration.

BRIEF DESCRIPTION OF THE DRAWINGS

FIG. 1 is a front view of a fuel cell device according to an embodiment of the present invention.

FIG. 5 is a front view of the A-part in FIG. 1 when the connector is rotated.

MODE FOR CARRYING OUT THE INVENTION

Figure 2:
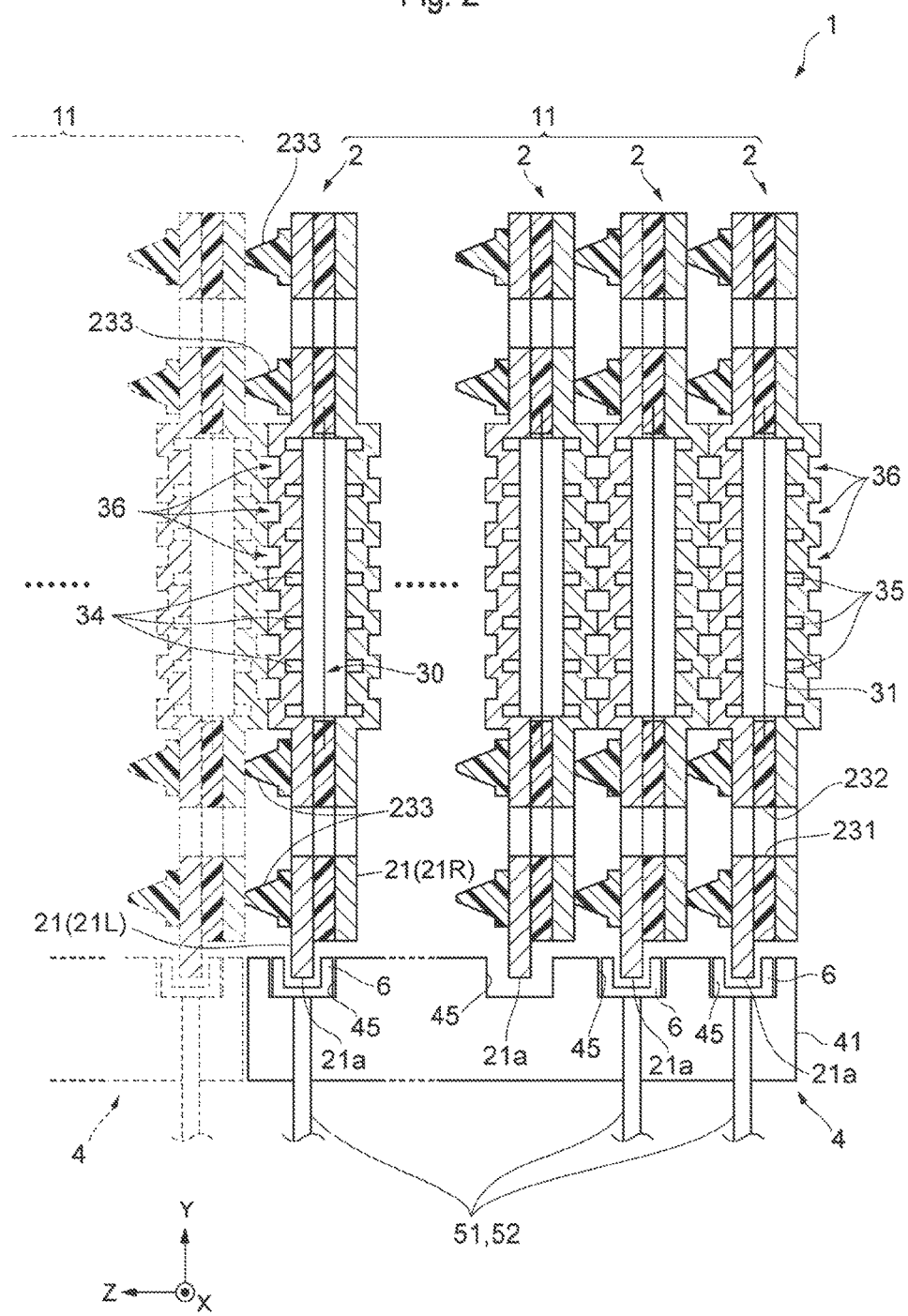
FIG. 2 is a schematic diagram of a fuel cell device according to an embodiment of the present invention.

Hereinafter, embodiments of the present invention will be described with reference to the attached drawings. In the drawings, for ease of understanding, the same elements will be given the same reference numerals wherever possible, and any repetitive descriptions will be omitted.

First, a fuel cell device according to an embodiment of the present invention will be described with reference to FIGS. 1 and 2. FIG. 1 is a front view of a fuel cell device 1 according to an embodiment of the present invention and FIG. 2 is a schematic view of such fuel cell device 1 according to an embodiment of the present invention.

As shown in FIG. 1, the fuel cell device 1 which is formed of a plurality of fuel cells 2 has a substantially square outer shape when seen in a front view. A connector 4 for measuring the voltage of the fuel cells 2 is electrically connected to an end of the fuel cell device 1 and such end corresponds to a corner of the square.

As shown in FIG. 2, the fuel cell device 1 is formed by continuously connecting a plurality of fuel cell stacks 11 in the Z-direction (stacking direction). Each fuel cell stack 11 is formed by stacking twelve fuel cells 2, each having the same form, in the Z-direction (stacking direction) (the fuel cells 2 in the middle part of the fuel cell stack are not shown in FIG. 2). Each fuel cell 2 is formed of, for example, an electrolyte, for example, a membrane-electrode assembly (hereinafter referred to as an "MEA") 30, and a pair of separators 21 (one separator is denoted by 21L and the other by 21R in FIG. 2) that sandwich the MEA 30. The MEA and the separators 21L and 21R are each formed in an approximately rectangular planar shape. The MEA 30 is formed such that the outer shape thereof is smaller than the outer shape of the separators 21L and 21R.

The MEA 30 is comprised of a polymer electrolyte membrane (hereinafter also simply referred to as an electrolyte membrane) 31 which is made of a polymer material ion-exchange membrane, and a pair of electrodes (diffusion electrodes on the anode and the cathode) which sandwich the electrolyte membrane 31. The electrolyte membrane 31 is formed so as to be larger in size than each of the electrodes. Each electrode is bonded to the electrolyte membrane 31 in accordance with, for example, hot pressing, while leaving the peripheral portion of the electrolyte membrane 31.

Each electrode that constitutes the MEA 30 is formed of, for example, a porous carbon material (diffusion layer) having a catalyst of, for example, platinum attached to the surface thereof. Hydrogen gas serving as a fuel gas (reactant gas) is supplied to one of the electrodes (anode), while an oxidizing gas (reactant gas) such as air or an oxidant is supplied to the other electrode (cathode), and these two reactant gases cause an electrochemical reaction within the MEA 30 so that electromotive force can be obtained from the fuel cells 2.

The separator 21 is formed of a gas-impermeable conductive material. Examples of the conductive material include carbon, conductive hard resins and metals such as aluminum and stainless steel. The base material of the separator 21 in the present embodiment is a metal plate, and a film with excellent corrosion resistance (e.g., metal-plated coating) is formed on a surface of the base material facing the electrode.

A groove-like flow path formed of a plurality of recessed parts is provided on both sides of the separator 21. Such flow path can be made, for example, by way of pressing if the base material of the separator is a metal plate as in the separator 21 of the present embodiment. The groove-like flow path formed in this manner provides an oxidizing gas flow path 34, a hydrogen gas flow path 35 and a cooling water flow path 36. More specifically, a plurality of hydrogen gas flow paths 35 is provided on the inner side, i.e., the electrode side of the separator 21R, while a plurality of cooling water flow paths 36 is provided on the back side (outer side). Similarly, a plurality of oxidizing gas flow paths 34 is provided on the inner side, i.e., the electrode side of the separator 21L, while a plurality of cooling water flow paths 36 is provided on the back side (outer side). The present embodiment is configured such that, when the outer surface of the separator 21L of one of the two adjacent cells 2, 2 comes into contact with the outer surface of the separator 21R of the other (adjacent) cell 2, the cooling water flow paths 36 of the two cells together form flow paths having a rectangular cross-section.

A first gasket 231 and a second gasket 232 are provided between the separators 21L and 21R which constitute the fuel cell 2, so as to separate the flow paths formed in the fuel cell 2. Further, a third gasket 233 formed of a plurality of members (e.g., four rectangular small frames and one big frame for creating a fluid flow path) is provided between the respective separators 21L and 21R of the adjacent fuel cells 2, 2. This third gasket 233 is provided so as to be placed in a space between the periphery of the cooling water flow paths 36 in the separator 21L and the periphery of the cooling water flow paths 36 in the separator 21R and serves as a member for sealing the space.

An end 21a of the separator 21L in the Y-direction is formed so as to project in the Y direction relative to an end of the separator 21R. The above-described connector 4 for measuring the voltage of the fuel cells 2 is electrically connected to the end 21a. More specifically, the connector 4 has a housing 41 made of resin, and twelve slits 45 are formed at an end portion of the housing 41 at substantially the same pitch as the pitch of the fuel cells 2 in the stacking direction. The end 21a of each separator 21L is configured so as to be able to be inserted into each slit 45. Further, eleven metal terminals 6 are provided inside the housing 41. The respective terminals 6 are arranged in eleven of the twelve slits 45 formed in the housing 41 so as to be exposed from inside the housing 41. When the end 21a of the separator 21L is inserted into each slit 45, the end 21a is held by the terminal 6, thereby establishing an electric connection between the connector 4 and the fuel cell device 1. A wire 51 or wire 52, being an electric cable extending to another electrical part, is connected to each terminal. The voltage of the fuel cell 2 is measured using such electrical part.

Figure 3:
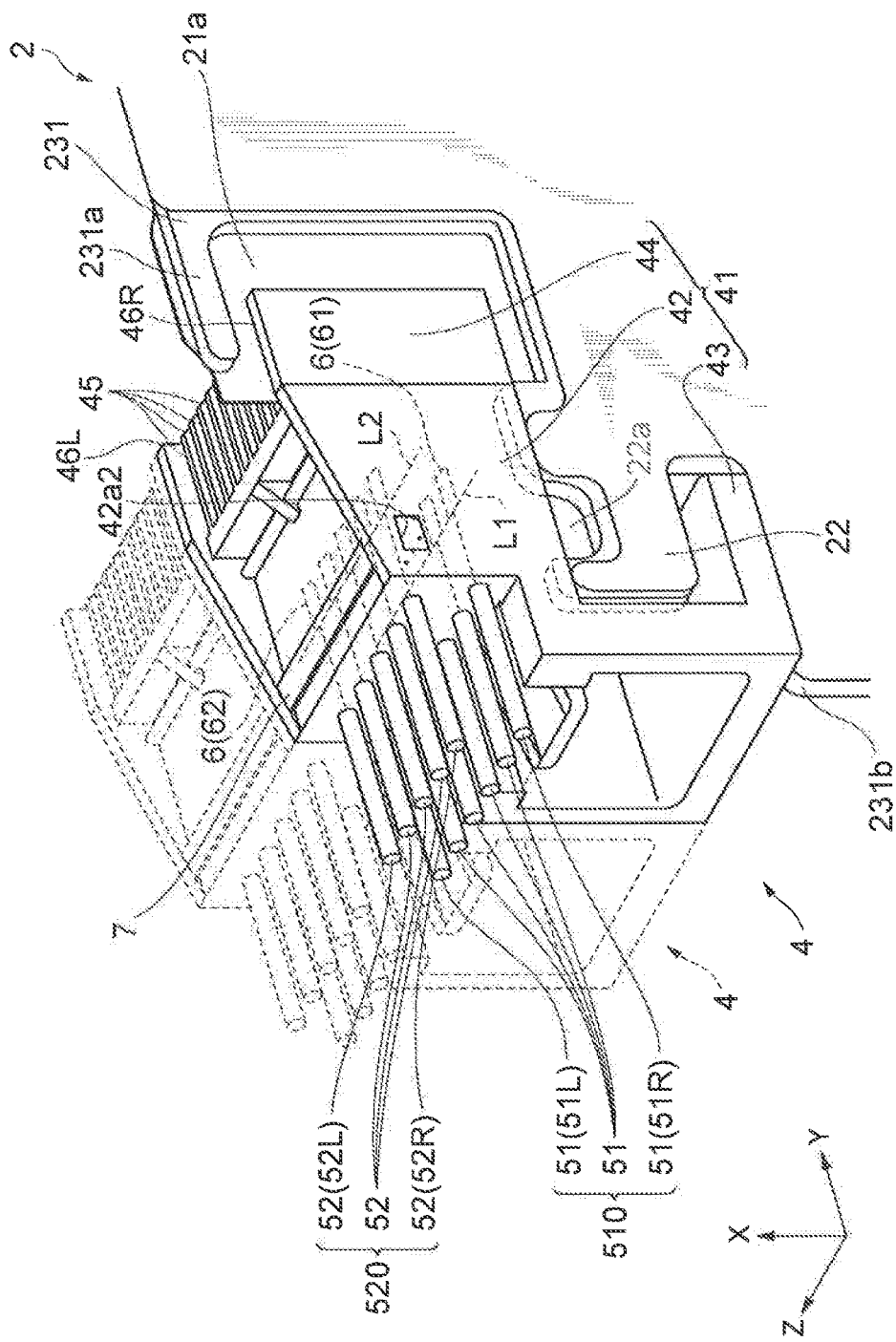
FIG. 3 is a perspective view of the A-part in FIG. 1.

Next, the details of the connector 4 and the connected state of the connector 4 with the fuel cell device 1 will be described with reference to FIGS. 3 and 4. FIG. 3 is a perspective view of the A-part in FIG. 1 and FIG. 4 is a perspective view of the connector 4 according to an embodiment of the present invention.

The details of the connector 4 will be described first. As shown in FIG. 3, the housing 41 of the connector 4 is comprised of: a body 42; a fixation part 43 provided at one end of the body 42; and a connection part 44 provided at the other end of the body 42, and these parts are integrally formed of a resin material. The outer shape of the housing 41 is approximately U-shaped when seen in a front view.

Figure 4:
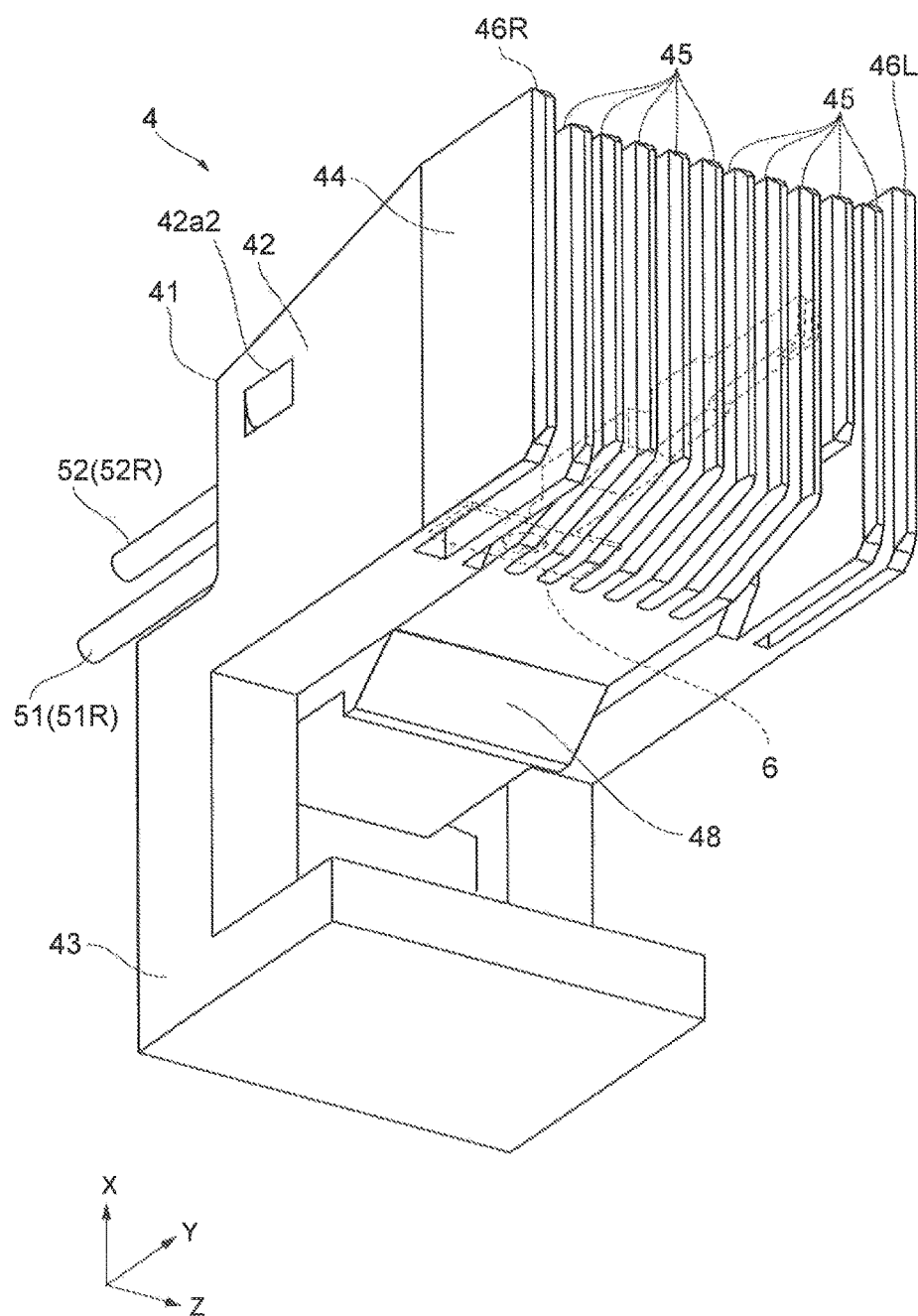
FIG. 4 is a perspective view of a connector according to an embodiment of the present invention.

Provided inside the body 42 of the housing 41 are eleven terminals 6 which are made of metal (for simplicity, the terminals 6 are just briefly shown in FIG. 4). The eleven terminals 6 are composed of a first terminal group 61 and a second terminal group 62. The first terminal group 61 is a group of six terminals 6 arranged on a first line L1 extending in the stacking direction (the Z-direction) of the fuel cells 2 with spaces therebetween, while the second terminal group 62 is a group of five terminals 6 arranged on a second line L2 which is substantially parallel to the first line L1, with spaces therebetween. In other words, the eleven terminals 6 are arranged in two lines and the number of terminals 6 in the second terminal group 62, positioned on the upper side in FIG. 3, is smaller by one than the number of terminals 6 in the first terminal group 61. It should be noted that a retainer 7 is arranged inside the body 42 as a separate member from the body 42, and an engagement hole 42a2 (recessed part) is formed on the front-side wall of the body 42. The detailed configuration of such retainer and engagement hole will be described later.

At one end in the Y-direction of the body 42, eleven wires 51, 52 are inserted and electrically connected to the respective terminals 6 inside the body 42. More specifically, six wires 51 to be connected to the first terminal group 61 are aligned at positions corresponding to the terminals 6 in the first terminal group 61, while five wires 52 to be connected to the second terminal group 62 are aligned at positions corresponding to the terminals 6 in the second terminal group 62. With this arrangement, the eleven wires 51, 52 also form a first group 510 of wires arranged in a line and a second group 520 of wires arranged substantially parallel to the first wire group 510. The terminals 6 connected to the wires 52L and 52R located at both ends of the second wire group 520 are positioned closer to the center part of the housing 41 in the Z direction than the terminals 6 connected to the wires 51L and 51R located at both ends of the first wire group 510.

The fixation part 43 is formed below the wires 51 and 52 of the body 42. Furthermore, as shown in FIG. 4, a fixation hook 48 is provided on an outer surface of the body 42 close to the fixation part 43, such that it projects toward the fixation part 43. The fixation hook 48 is configured such that, due to the elasticity of the resin material forming the housing 41, the fixation hook 48 can be displaced within a predetermined range in the X direction, upon application of external force. As explained later, the fixation hook 48 and the fixation part 43 contribute to preventing detachment of the connector 4 from the fuel cell device 1.

As shown in FIGS. 3 and 4, the connection part 44 is formed at the opposite end of the body 42 from the fixation part 43. Twelve slits 45 are formed in the connection part 44 with substantially the same pitch as the pitch of the fuel cells 2 in the stacking direction (the Z-direction). The end 21a of the separator 21L constituting the fuel cell 2 can be inserted into each slit 45 (for simplicity, only a single fuel cell 2 is shown in FIG. 3). A pair of ribs 46L and 46R is formed at both ends of the connection part 44 in the Z-direction so as to project in a direction perpendicular to the Z-direction (i.e., projecting in a direction perpendicular to the stacking direction of the fuel cells 2).

Next, the state in which the connector 4 has been connected to the fuel cell device 1 will be described in detail. The connector 4 is connected by way of the process of pressing the connector 4 in the Y-direction into an end of the fuel cell device 1. More specifically, as shown in FIG. 3, the connector 4 is pressed into the fuel cell device 1 so that the ends 231a of the twelve first gaskets 231 of the fuel cells 2 are inserted respectively into the twelve slits 45 of the housing 41. As a result, each of the paired ribs 46L and 46R of the housing 41 is positioned so as to project toward the end 231a of the first gasket 231 of the fuel cell 2, the end 231a being formed by extending a part of an end of the first gasket 231.

Furthermore, the body 42 and the fixation part 43 of the housing 41 are arranged so that a projecting piece 22 which is formed at an end of the fuel cell 2 can be placed between the body 42 and the fixation part 43. A groove 22a is formed on the upper part of the projecting piece 22 so as to be recessed downward. When the connector 4 is pressed into the fuel cell device 1 in the Y direction for connection, the fixation hook 48 provided in the body 42 interferes with the tip of the projecting piece 22, is displaced in the X direction, and then returns to the original position so as to enter the groove 22a. In other words, the fixation part 48 and the groove 22a serve as a snap-fit structure and their engagement can provide a simple structure for preventing detachment of the connector 4.

Next, the situation in which an external force is applied to rotate the connector 4 will be described with reference to FIG. 5. FIG. 5 is a front view of the A-part shown in FIG. 1 where the connector 4 is rotated.

As described above, under the situation in which the connector 4 is connected to the fuel cells 2, the end 21a of each separator 21 is inserted into each slit 45 of the connector 4. Accordingly, if an external force is applied to the connector 4, movement of the connector 4 in the Z-direction will be restricted by the end 21a, but the connector 4 can move in the X-direction and the Y-direction along the end 21a. Furthermore, the connector 4 can rotate in the direction shown by the arrow R along the end 21a with the tip of the projecting piece 22 as a pivoting point (i.e., the connector 4 can rotate about an axis parallel to the Z-direction).

If such rotation of the connector 4 in the direction shown by the arrow R is not restricted in any manner, the rotation will cause the fixation hook 48 to go out of the groove 22a of the projecting piece 22, engagement between the fixation hook 48 and the groove 22a will be released, and the connector 4 will be detached from the fuel cell device 1.

In view of the above, the connector 4 is configured such that, when it rotates in the direction shown by the arrow R, the connection part 44 of the connector 4 moves outward of the fuel cells 2 and the rib 46R provided in the connection part 44 interferes with the end 231a of the first gasket 231 (see the B-part). As a result, the rotation of the connector 4 can be suppressed and the fixation hook 48 and the groove 22a of the projecting piece 22 can be kept engaged with each other so that detachment of the connector 4 can be prevented.

In addition, as described above by referring to FIG. 3, the eleven terminals 6 provided inside the housing 41 of the connector 4 are arranged in two lines, namely, a line of the first terminal group 61 and a line of the second terminal group 62, and the number of terminals 6 in the second terminal group 62, located on the upper side, is smaller by one than the number of terminals 6 in the first terminal group 61. Moreover, the terminals 6 connected to the wires 52L and 52R located at both ends of the second wire group 520 are arranged closer to the center part of the housing 41 in the Z-direction than the terminals 6 connected to the wires 51L and 51R located at both ends of the first wire group 510. Accordingly, compared to the case in which the first and second terminal groups 61 and 61 have the same number of terminals, projection of the body 42 of the housing 41 in the Z-direction can be reduced or eliminated. As a result, in the case where several connectors 4 are aligned in the stacking direction of the fuel cells 2 as shown in FIG. 3, if a connector 4 rotates in the direction shown by the arrow R in FIG. 5 due to application of an external force, interference with the adjacent connector 4 and possible breakage attributable to such interference can be suppressed.

Figure 6:
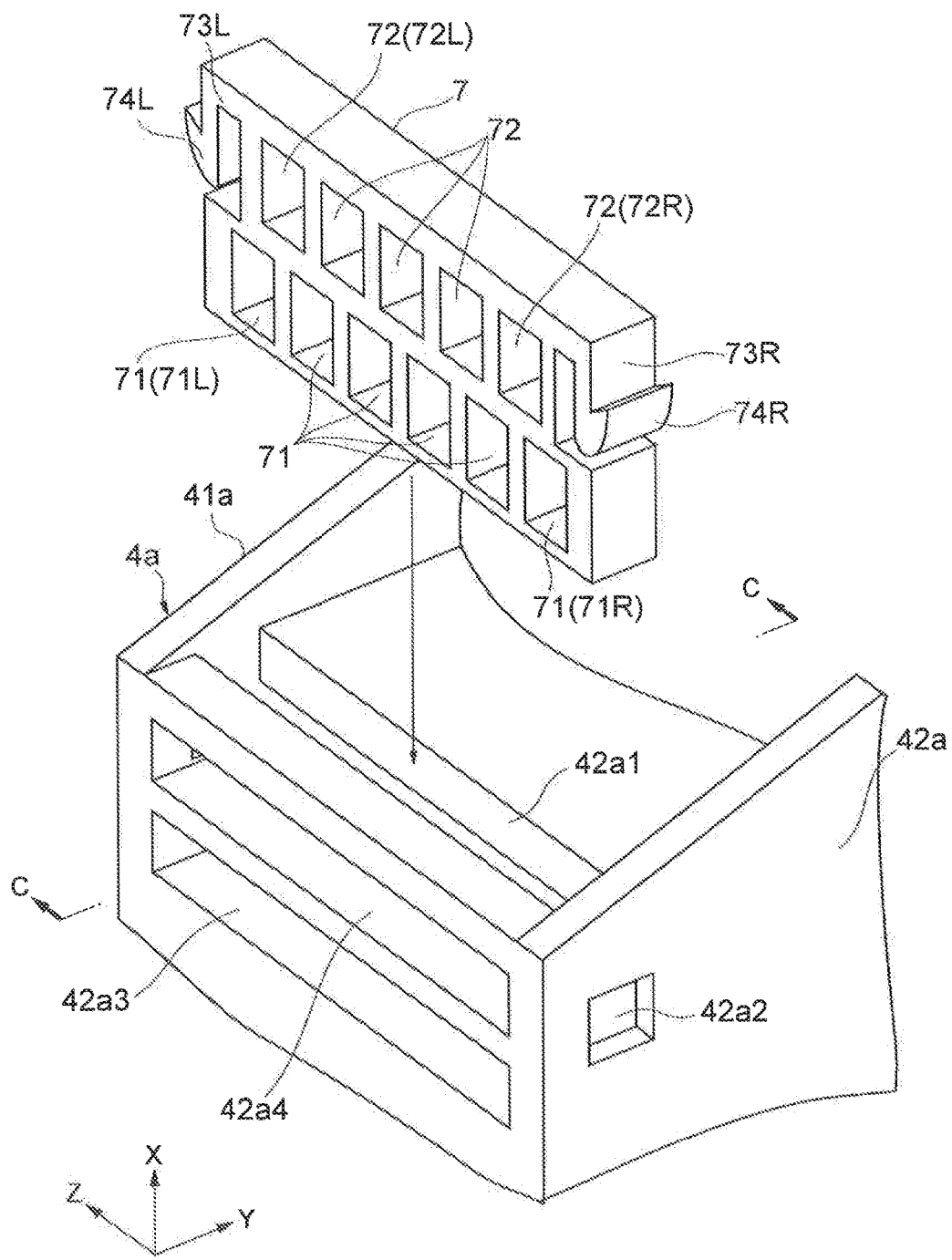
FIG. 6 is a perspective view of a connector according to another embodiment of the present invention.
Figure 7:
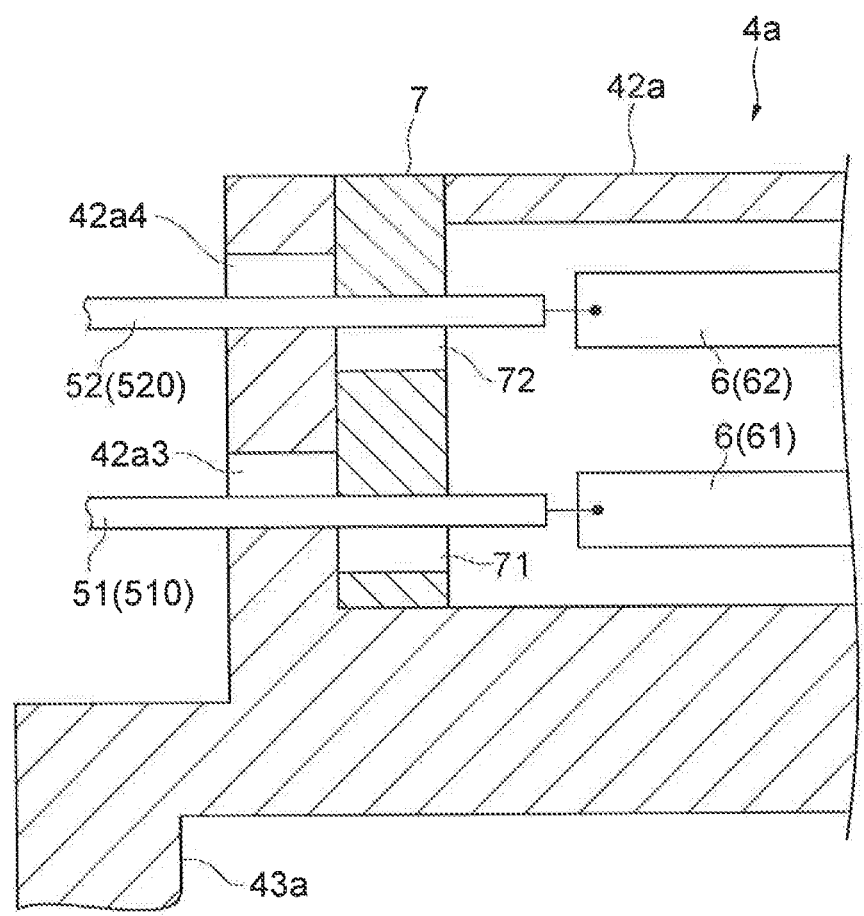
FIG. 7 is a cross sectional view along the line C-C in FIG. 6.

Next, a connector according to another embodiment of the present invention will be described with reference to FIGS. 6 and 7. FIG. 6 is a perspective view of a connector 4a according to another embodiment of the present invention and FIG. 7 is a cross-sectional view along the line C-C in FIG. 6. It should be noted that such connector 4a according to another embodiment of the present invention is a modification of the above-described connector 4 in which the configuration of the body 42 of the housing 41 has been changed. Accordingly, the connector 4a will be described below with regard to such difference, and other explanations will be omitted.

As shown in FIG. 6, the connector 4a has a retainer 7 which is to be arranged inside the body 42a, as a separate member from the body 42a.

The retainer 7 is a member formed of resin with a plate-like outer shape, and has six through-holes 71 and five through-holes 72 extending therethrough in its thickness direction (the Y-direction). The six through-holes 71 are aligned in the Z-direction, with a through-hole 71L at one end and a through-hole 71R at the other end. The five through-holes 72 are positioned above the six through-holes 71 and aligned in the Z-direction, with a through-hole 72L at one end and a through-hole 72R at the other end. The through-holes 72L and 72R located at both ends of the five through-holes 72 are positioned closer to the center part of the retainer 7 in the Z-direction than the through-holes 71L and 71R located at both ends of the six through-holes 71.

Plate-like arms 73L and 73R are provided at both ends in the Z-direction of the retainer 7 and extend obliquely downward from the upper end of the retainer 7. At the lower end of each arm 73L, 73R, an engagement hook (lock) 74L, 74R is formed so as to project upward. The arms 73L and 73R each have a thickness which allows the arm to bend in the Z-direction due to its elasticity, and upon bending of the arms 73L and 73R, the engagement hooks 74L and 74R can be displaced in the Z-direction.

Meanwhile, a slit-like insertion hole 42a1 is formed at the upper end of the body 42a such that the longitudinal side of the hole extends in the Z-direction. On both end surfaces in the Z-direction of the body 42a, engagement holes (recessed parts) 42a2, 42a2 are formed at the positions corresponding to the position of the second terminal group 62 (not shown in FIG. 6) in the X-direction (In FIG. 6, the engagement hole 42a2 formed on the end surface at the back side in the drawing is not shown). Moreover, a slit-like insertion hole 42a3 for the first wire group and a slit-like insertion hole 42a4 for the second wire group are formed at one end in the Y-direction of the body 42a such that the longitudinal side of each hole extends in the Z-direction. The insertion hole 42a1, engagement holes 42a2, 42a2, first wire group insertion hole 42a3 and second wire group insertion hole 42a4 are all in communication with the interior of the body 42a.

When pressing the retainer 7 into the insertion hole 42a1 so as to place the retainer 7 inside the body 42a, the engagement hooks 74L and 74R are first brought into contact with an end of the insertion hole 42a1 so that the arms 73L and 73R bend in the Z-direction. Due to this the engagement hooks 74L and 74R are displaced in the Z-direction toward the center part of the retainer 7 and, as a result, the outer dimension of the retainer 7 in the Z-direction is reduced so as to thereby allow the insertion of the retainer 7.

As shown in FIG. 7, when the retainer 7 has been inserted so that the lower end thereof reaches the inner surface of the body 42a, the engagement hooks 74L and 74R fit into the engagement holes 42a2, 42a2. As a result, the bended arms 73L and 73R move outward of the body 42a and return to the original position, thereby achieving the engagement between the engagement hooks 74L and 74R and the engagement holes 42a2, 42a2.

When the retainer 7 is placed inside the body 42a, the first wire group insertion hole 42a3 of the body 42a is in communication with the six through-holes 71 of the retainer 7 and the second wire group insertion hole 42a4 of the body 42a is in communication with the five through-holes 72 of the retainer 7. Here, the first wire group insertion hole 42a3 is in communication with the through-holes 71 so as to be slightly offset in the X-direction and the second wire group insertion hole 42a4 is in communication with the through-holes 72 so as to be slightly offset in the X-direction. Accordingly, six wires 51 of the first wire group 510 which are inserted through the first wire group insertion hole 42a3 and the insertion holes 71 are sandwiched by the respective inner surfaces of the first wire group insertion hole 42a3 and the insertion holes 71, and are held so that the wires do not drop off the body 42a. Similarly, five wires 52 of the second wire group 520 which are inserted through the second wire group insertion hole 42a4 and the insertion holes 72 are also sandwiched by the respective inner surfaces of the second wire group insertion hole 42a4 and the insertion holes 72, and are held so that the wires do not drop off the body 42a.

By engaging the engagement hooks (locks) 74L and 74R with the engagement holes (recessed parts) 42a2, 42a2 of the housing 41a in this manner, projection of the retainer 7 from the housing 41a can be suppressed. As a result, checking the connection state between the connector 4a and the fuel cell device 1 will be easy and connection can be further ensured.

Embodiments of the present invention have been described above by referring to specific examples. However, the present invention is not limited to those specific examples. In other words, modifications of those examples, which will be made by a person skilled in the art as appropriate, are also included in the scope of the present invention as long as they have the features of the present invention. For example, each element in the above-described specific examples and the arrangement, materials, conditions, shapes, dimensions, etc., of such element are not limited to those described above and may be modified as appropriate. In addition, each element included in each of the above-described embodiments may be combined as long as such combination is technically possible and such combination is also included in the scope of the present invention as long as it has the features of the present invention.

DESCRIPTION OF REFERENCE NUMERALS

1 . . . fuel cell device; 2 . . . fuel cell; 21, 21L, 21R . . . separator; 21a . . . end (of separator); 231 . . . first gasket; 231a . . . end (of first gasket 231); 4, 4a . . . connector; 41, 41a . . . housing; 42a2 . . . engagement hole (recessed part); 45 . . . slit; 46L, 46R, . . . rib; 51, 52 . . . wire; 6 . . . terminal; 61 . . . first terminal group; 62 . . . second terminal group; 7 . . . retainer; 74L, 74R . . . engagement hook (lock); L1 . . . first line; and L2 . . . second line

What is claimed is:

1. A cell monitor connector to be connected to an end of a fuel cell device formed of a plurality of fuel cells stacked in a predetermined stacking direction, so as to measure voltage, the cell monitor connector comprising:
    a housing having a plurality of slits formed therein, wherein an end of a separator of the plurality of fuel cells can be inserted into the slits;
    a plurality of terminals provided inside the housing and electrically connectable to the end of the separator when the separator is inserted into the slit; and
    wires connected to the terminals,
    wherein the housing has a rib at at least one end in the stacking direction such that the rib projects in a direction perpendicular to the stacking direction and in a direction to insert the cell monitor connector into the end of the separator, and
    wherein the rib is formed at a position facing a gasket of the fuel cell where the rib will interfere with the gasket of the fuel cell so as to restrict rotation of the cell monitor connector around an axis parallel to the stacking direction when the cell monitor connector is connected to the end of the fuel cell device.

2. The cell monitor connector according to claim 1, wherein the plurality of terminals is composed of:
    a first terminal group including a first number of the terminals arranged with spaces therebetween on a first line extending in the stacking direction; and
    a second terminal group including a second number of the terminals arranged with spaces therebetween on a second line which is substantially parallel to the first line, the second number being smaller than the first number by one, and
    wherein the terminals arranged at both ends of the second terminal group are closer to a center part of the housing in the stacking direction than the terminals arranged at both ends of the first terminal group.

3. The cell monitor connector according to claim 2, comprising a retainer which is inserted into the housing and holds the wires, wherein:
    the housing has a recessed part on an outer surface thereof at a portion corresponding to the second terminal group; and
    the retainer is configured so as to be fixed to the housing when a lock formed at both ends of the retainer is engaged with the recessed part.

\* \* \* \* \*